United States Patent
Uesugi et al.

(10) Patent No.: US 10,355,119 B2
(45) Date of Patent: Jul. 16, 2019

(54) METHOD FOR MANUFACTURING SEMICONDUCTOR DEVICE

(71) Applicant: Kabushiki Kaisha Toshiba, Minato-ku (JP)

(72) Inventors: Kenjiro Uesugi, Kawasaki (JP); Aya Shindome, Yokohama (JP); Daimotsu Kato, Kawasaki (JP); Masahiko Kuraguchi, Yokohama (JP); Shinya Nunoue, Ichikawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/670,495

(22) Filed: Aug. 7, 2017

(65) Prior Publication Data

US 2018/0219088 A1    Aug. 2, 2018

(30) Foreign Application Priority Data

Feb. 1, 2017   (JP) .................................. 2017-017048

(51) Int. Cl.
*H01L 21/306* (2006.01)
*H01L 21/02* (2006.01)
(Continued)

(52) U.S. Cl.
CPC .... *H01L 29/7787* (2013.01); *H01L 21/02046* (2013.01); *H01L 21/02057* (2013.01);
(Continued)

(58) Field of Classification Search
CPC ... H01L 21/02; H01L 21/302; H01L 21/3065; H01L 21/338; H01L 21/461;
(Continued)

(56) References Cited

U.S. PATENT DOCUMENTS

| | | | |
|---|---|---|---|
| 2002/0001864 A1 | 1/2002 | Ishikawa et al. | |
| 2003/0127041 A1* | 7/2003 | Xu | ............................ C09G 1/02 117/2 |

(Continued)

FOREIGN PATENT DOCUMENTS

| | | |
|---|---|---|
| JP | 2002-26456 | 1/2002 |
| JP | 2002-324913 | 11/2002 |

(Continued)

*Primary Examiner* — Joseph M Galvin, III
(74) *Attorney, Agent, or Firm* — Oblon, McClelland, Maier & Neustadt, L.L.P.

(57) ABSTRACT

According to one embodiment, a method for manufacturing a semiconductor device is disclosed. The method can include forming a trench and exposing a portion of a first film at a bottom portion of the trench by removing a portion of a second film by performing dry etching using a gas including a first element. The second film is provided on the first film. The first film includes $Al_{x1}Ga_{1-x1}N$ ($0 \le x1 < 1$). The second film includes $Al_{x2}Ga_{1-x2}N$ ($0 < x2 < 1$ and $x1 < x2$). The method can include performing heat treatment while causing the portion being exposed of the first film to contact an atmosphere including $NH_3$, forming an insulating film on the portion of the first film after the heat treatment, and forming an electrode on the insulating film.

11 Claims, 9 Drawing Sheets

(51) Int. Cl.
*H01L 29/778* (2006.01)
*H01L 29/66* (2006.01)
*H01L 29/10* (2006.01)
*H01L 29/423* (2006.01)
*H01L 29/20* (2006.01)

(52) U.S. Cl.
CPC .... *H01L 21/30621* (2013.01); *H01L 29/1066* (2013.01); *H01L 29/4236* (2013.01); *H01L 29/66462* (2013.01); *H01L 29/2003* (2013.01)

(58) Field of Classification Search
CPC . H01L 21/02046; H01L 29/66; H01L 29/778; H01L 29/812; H01L 29/66462; H01L 29/2003
See application file for complete search history.

(56) References Cited

U.S. PATENT DOCUMENTS

| | | | |
|---|---|---|---|
| 2004/0192043 A1* | 9/2004 | Makita | H01L 21/02046 438/689 |
| 2008/0121895 A1* | 5/2008 | Sheppard | H01L 21/26553 257/76 |
| 2010/0025730 A1* | 2/2010 | Heikman | H01L 29/7787 257/194 |
| 2010/0087052 A1* | 4/2010 | Xu | H01J 37/321 438/530 |
| 2010/0327292 A1* | 12/2010 | Dwilinski | C30B 9/00 257/76 |
| 2012/0149161 A1 | 6/2012 | Ohki et al. | |
| 2014/0015037 A1* | 1/2014 | Ng | H01L 29/78 257/330 |
| 2015/0236103 A1* | 8/2015 | Kuraguchi | H01L 29/2003 257/190 |
| 2016/0043209 A1* | 2/2016 | Oyama | H01L 29/1029 257/194 |

FOREIGN PATENT DOCUMENTS

| | | |
|---|---|---|
| JP | 2004-186679 | 7/2004 |
| JP | 2012-124441 | 6/2012 |
| JP | 2014-90033 | 5/2014 |
| JP | 2014-222763 | 11/2014 |

* cited by examiner

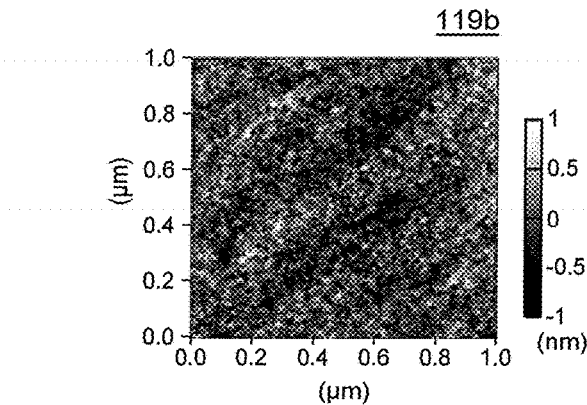
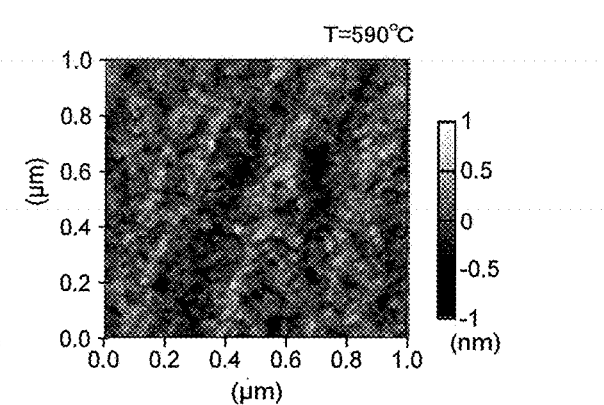
FIG. 11A
FIG. 11B
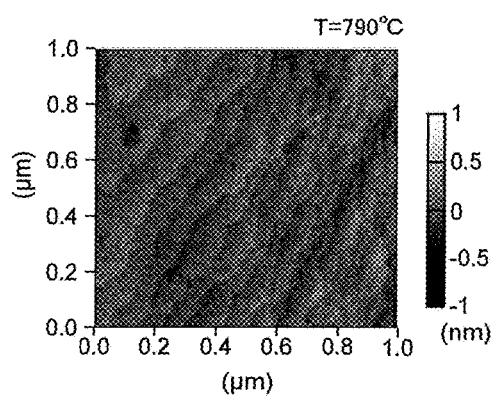
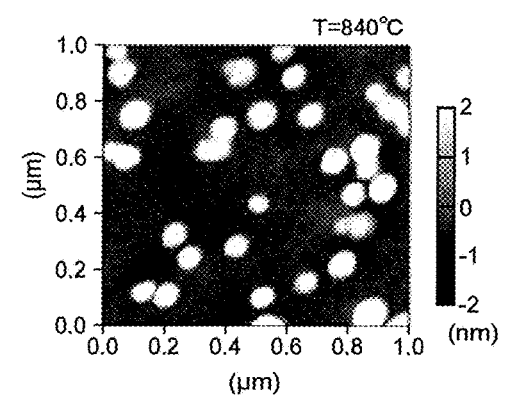
FIG. 11C
FIG. 11D

METHOD FOR MANUFACTURING SEMICONDUCTOR DEVICE

CROSS-REFERENCE TO RELATED APPLICATIONS

This application is based upon and claims the benefit of priority from Japanese Patent Application No. 2017-017048, filed on Feb. 1, 2017; the entire contents of which are incorporated herein by reference.

FIELD

Embodiments described herein relate generally to a method for manufacturing a semiconductor device.

BACKGROUND

For example, it is desirable to improve the performance of a semiconductor device.

BRIEF DESCRIPTION OF THE DRAWINGS

FIG. 11A to FIG. 11D are atomic force microscope (AFM) images showing the evaluation results of the semiconductor device;

Figure 1:
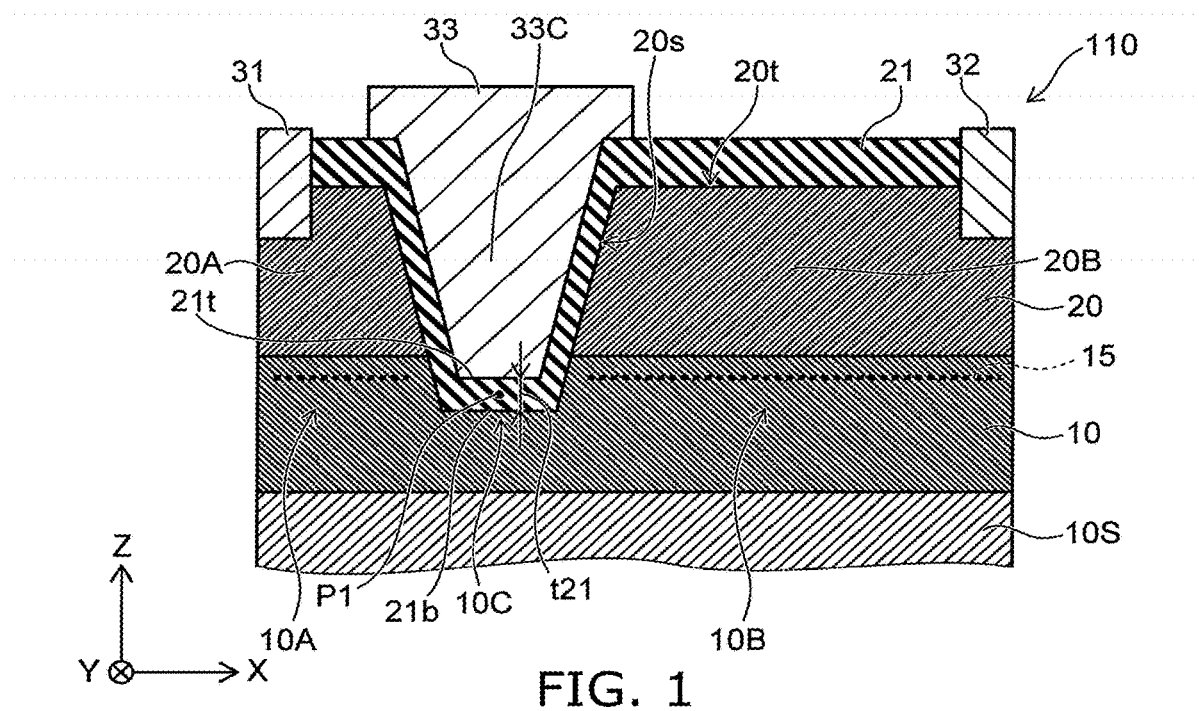
FIG. 1 is a schematic cross-sectional view illustrating a semiconductor device manufactured using a method for manufacturing the semiconductor device according to a first embodiment.

According to one embodiment, a method for manufacturing a semiconductor device is disclosed. The method can include forming a trench and exposing a portion of a first film at a bottom portion of the trench by removing a portion of a second film by performing dry etching using a gas including a first element. The second film is provided on the first film. The first film includes $Al_{x1}Ga_{1-x1}N$ ($0 \leq x1 < 1$). The second film includes $Al_{x2}Ga_{1-x2}N$ ($0 < x2 < 1$ and $x1 < x2$). The method can include performing heat treatment while causing the portion being exposed of the first film to contact an atmosphere including $NH_3$, forming an insulating film on the portion of the first film after the heat treatment, and forming an electrode on the insulating film. The insulating film has a first position at a center in a first direction. The first direction is from the portion of the first film toward the electrode. A concentration of the first element at the first position is $1 \times 10^{18}$ cm$^{-3}$ or less.

According to another embodiment, a method for manufacturing a semiconductor device is disclosed. The method can include forming a trench and exposing a portion of a first film at a bottom portion of the trench by removing a portion of a second film provided on the first film, the first film including $Al_{x1}Ga_{1-x1}N$ ($0 \leq x1 < 1$). The second film includes $Al_{x2}Ga_{1-x2}N$ ($0 < x2 < 1$ and $x1 < x2$). The method can include performing heat treatment at a temperature of 790° C. or less while causing the exposed portion of the first film to contact an atmosphere including $NH_3$.

According to another embodiment, a method for manufacturing a semiconductor device is disclosed. The method can include forming a trench and exposing a portion of a first film at a bottom portion of the trench by removing a portion of a second film provided on the first film. The first film includes $Al_{x1}Ga_{1-x1}N$ ($0 \leq x1 < 1$). The second film includes $Al_{x2}Ga_{1-x2}N$ ($0 < x2 < 1$ and $x1 < x2$). The method can include performing heat treatment at a temperature of 900° C. or less while causing the exposed portion of the first film to contact an atmosphere including $NH_3$.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

FIRST EMBODIMENT

FIG. 1 is a schematic cross-sectional view illustrating a semiconductor device manufactured using a method for manufacturing the semiconductor device according to a first embodiment.

As shown in FIG. 1, the semiconductor device 110 includes a first layer 10, a second layer 20, an insulating film 21, a first conductive portion 31 (a first electrode), a second conductive portion 32 (a second electrode), and an electrode 33.

The first layer 10 includes $Al_{x1}Ga_{1-x1}N$ ($0 \leq x1 < 1$). The composition ratio x1 of the first layer 10 is, for example, 0.05 or less. For example, the first layer 10 is ud-GaN to which deliberate doping of an impurity is not performed. The impurity concentration of the first layer 10 is, for example, $1 \times 10^{17}$ cm$^{-3}$ or less. The first layer 10 is, for example, i-GaN. For example, a deliberate impurity is not included in the first layer 10.

The second layer 20 is provided on the first layer 10. The second layer 20 includes $Al_{x2}Ga_{1-x2}N$ ($0<x2<1$ and $x1<x2$). The composition ratio x2 of the second layer 20 is, for example, not less than 0.1 and not more than 0.4. The composition ratio x2 may be, for example, not less than 0.15 and not more than 0.35. The second layer 20 is, for example, $Al_{0.25}Ga_{0.75}N$.

The first conductive portion 31 is provided on a portion of the second layer 20. The second conductive portion 32 is provided on another portion of the second layer 20. The electrode 33 is provided between the first conductive portion 31 and the second conductive portion 32. A trench is provided in the second layer 20; and the insulating film 21 is provided between the electrode 33 and the first layer 10 at the bottom portion of the trench.

The first layer 10 is separated from the first conductive portion 31 and the second conductive portion 32 in a first direction. The second conductive portion 32 is separated from the first conductive portion 31 in a second direction. The first direction crosses the second direction.

The second direction is taken as an X-axis direction. A direction perpendicular to the X-axis direction is taken as a Z-axis direction. A direction perpendicular to the X-axis direction and the Z-axis direction is taken as a Y-axis direction. The first direction is, for example, the Z-axis direction. The second direction is, for example, the X-axis direction.

A first portion 20A of the second layer 20 is provided between the first conductive portion 31 and a first partial region 10A of the first layer 10 in the Z-axis direction. A second portion 20B of the second layer 20 is provided between the second conductive portion 32 and a second partial region 10B of the first layer 10 in the Z-axis direction.

The first conductive portion 31 is electrically connected to the first portion 20A of the second layer 20. The second conductive portion 32 is electrically connected to the second portion 20B of the second layer 20.

The first layer 10 includes a third partial region 10C. The third partial region 10C is between the first partial region 10A of the first layer 10 and the second partial region 10B of the first layer 10 in the X-axis direction.

The electrode 33 is separated from the third partial region 10C in the Z-axis direction. At least a portion of the insulating film 21 is between the electrode 33 and the third partial region 10C in the Z-axis direction.

A portion 33C of the electrode 33 overlaps the first portion 20A of the second layer 20 in the X-axis direction. The portion 33C of the electrode 33 overlaps the second portion 20B of the second layer 20 in the X-axis direction.

A portion of the insulating film 21 is provided between the portion 33C of the electrode 33 and the first portion 20A of the second layer 20. Another portion of the insulating film 21 is provided between the portion 33C of the electrode 33 and the second portion 20B of the second layer 20.

In the example, the insulating film 21 is provided also on an upper surface 20t of the second layer 20. The first portion 20A of the second layer 20 is positioned between the first partial region 10A of the first layer 10 and a portion of the insulating film 21 in the Z-axis direction. The second portion 20B of the second layer 20 is positioned between the second partial region 10B of the first layer 10 and another portion of the insulating film 21 in the Z-axis direction.

For example, a lower end portion 21b of the insulating film 21 contacts the third partial region 10C of the first layer 10 in a region overlapping the electrode 33 in the Z-axis direction. For example, an upper end portion 21t of the insulating film 21 contacts the electrode 33 in a region overlapping the electrode 33 in the Z-axis direction. A thickness t21 of the insulating film 21 is, for example, not less than 5 nm and not more than 100 nm in the region overlapping the electrode 33 in the Z-axis direction. The thickness t21 is, for example, 30 nm.

For example, the electrode 33 functions as a gate electrode having a recessed structure. The insulating film 21 functions as a gate insulating film. For example, the first conductive portion 31 functions as a source electrode. For example, the second conductive portion 32 functions as a drain electrode.

The insulating film 21 includes, for example, silicon oxide. The electrode 33 includes, for example, a material including at least one selected from the group consisting of Al, Ni, Au, TiN, WN, and polysilicon. The first conductive portion 31 and the second conductive portion 32 include, for example, a material including at least one selected from the group consisting of Al, Ti, Ni, and Au.

For example, the first layer 10 includes a portion on the second layer 20 side. A two-dimensional electron gas 15 (2DEG) is formed at this portion. The two-dimensional electron gas 15 functions as a current path. The two-dimensional electron gas 15 is provided in the first partial region 10A on the source side where the first conductive portion 31 is provided and in the second partial region 10B on the drain side where the second conductive portion 32 is provided. The two-dimensional electron gas 15 is not formed at the portion (the third partial region 10C) corresponding to the electrode 33.

The semiconductor device 110 is, for example, a normally-off MIS (Metal Insulator Semiconductor) transistor.

A substrate 10S is provided in the example. The first layer 10, the second layer 20, the insulating film 21, the electrode 33, the first conductive portion 31, and the second conductive portion 32 recited above are provided on the substrate 10S.

As described below, a trench is provided in the film used to form the second layer 20 by performing dry etching. The insulating film 21 is formed inside the trench; and the electrode 33 is formed by filling a conductive material into the remaining space. In the dry etching, there are cases where a first element (e.g., boron) remains in the first layer 10 (the third partial region 10C) at the bottom portion of the trench when, for example, a gas including the first element is used. In such a case, it was found that the first element diffuses into the insulating film 21 and causes degradation of the characteristics (e.g., fluctuation of the threshold voltage) to occur. In the embodiment, the concentration of the first element inside the insulating film 21 can be suppressed by performing a special heat treatment. Thereby, for example, the fluctuation of the threshold voltage can be suppressed.

As described below, in the semiconductor device 110 manufactured by the manufacturing method according to the embodiment, the concentration of the first element (e.g., boron) inside the insulating film 21 (e.g., at a first position P1) is $1 \times 10^{18}$ cm$^{-3}$ or less.

An example of the method for manufacturing the semiconductor device 110 according to the embodiment will now be described.

Figure 2:
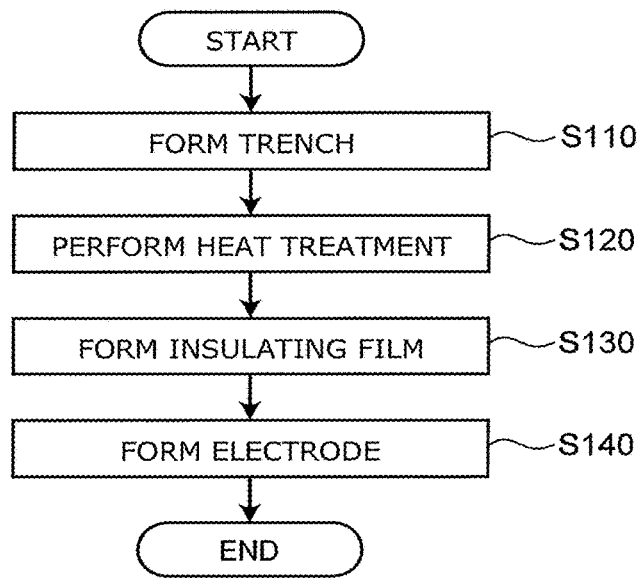
FIG. 2 is a flowchart illustrating the method for manufacturing the semiconductor device according to the first embodiment.

FIG. 2 is a flowchart illustrating the method for manufacturing the semiconductor device according to the first embodiment.

FIG. 3A to FIG. 3D and FIG. 4A to FIG. 4D are schematic cross-sectional views in order of the processes, illustrating the method for manufacturing the semiconductor device according to the first embodiment.

Figure 3A:
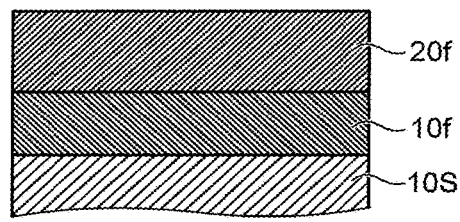
FIG. 3A to FIG. 3D are schematic cross-sectional views in order of the processes, illustrating the method for manufacturing the semiconductor device according to the first embodiment.

As shown in FIG. 3A, a first film 10f that includes $Al_{x1}Ga_{1-x1}N$ ($0 \leq x1 < 1$) is formed on the substrate 10S. A second film 20f that includes $Al_{x2}Ga_{1-x2}N$ ($0 < x2 < 1$ and $x1 < x2$) is formed on the first film 10f. The first film 10f is used to form the first layer 10. The second film 20f is used to form the second layer 20.

Figure 3B:
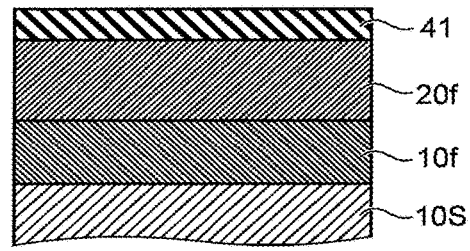

As shown in FIG. 3B, a hard mask 41 (e.g., SiN) is formed on the second film 20f. For example, the hard mask 41 may be formed by ECR sputtering.

Figure 3C:
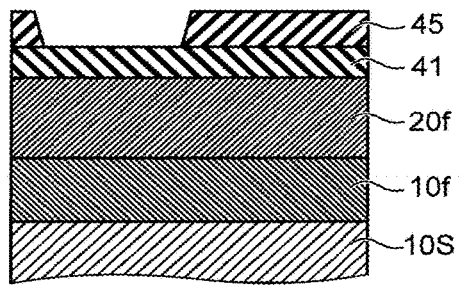

As shown in FIG. 3C, a resist film 45 that has a prescribed opening is formed on the hard mask 41. The thickness of the resist film 45 is, for example, about 1 μm to about 2 μm.

Figure 3D:
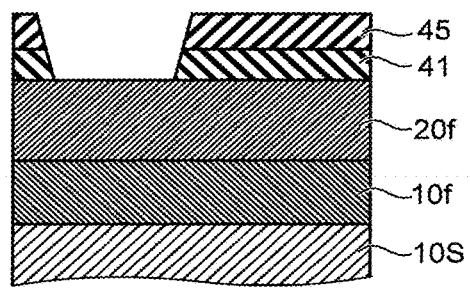

As shown in FIG. 3D, a portion of the hard mask 41 is removed using the resist film 45 as a mask. For example, the removal includes dry etching using $SF_6$ as the etching gas. Or, the removal includes, for example, wet etching using hydrofluoric acid.

Figure 4A:
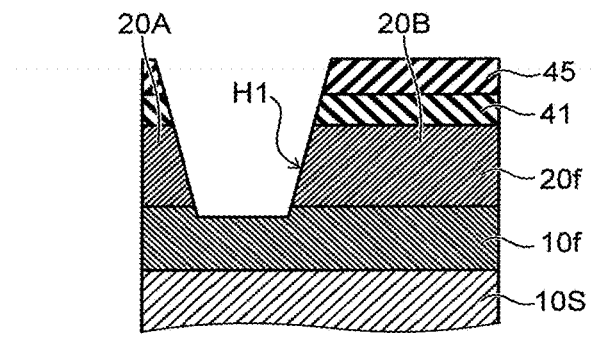
FIG. 4A to FIG. 4D are schematic cross-sectional views in order of the processes, illustrating the method for manufacturing the semiconductor device according to the first embodiment.

As shown in FIG. 4A, a trench H1 is formed by removing a portion of the second film 20f by using the resist film 45 and the hard mask 41 as a mask. Thereby, the first portion 20A and the second portion 20B are formed. The removal of the portion of the second film 20f (the formation of the trench H1) is performed by dry etching using a gas including the first element. The first element is, for example, boron. For example, a gas that includes $BCl_3$ and $Cl_2$ is used as the etching gas. Thereby, a portion 10p of the first film 10f is exposed at the bottom portion of the trench H1.

Thus, the trench H1 is formed by removing a portion of the second film 20f provided on the first film 10f by dry etching using a gas including the first element (step S110 of FIG. 2). Thereby, the portion 10p of the first film 10f is exposed at the bottom portion of the trench H1.

Figure 4B:
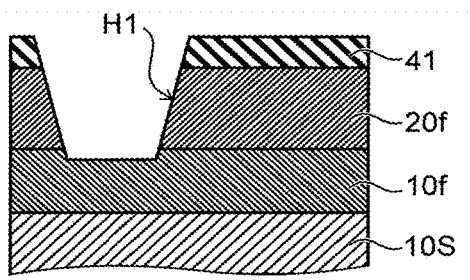

The resist film 45 is removed as shown in FIG. 4B. For example, the removal may be performed by organic cleaning and SH cleaning (cleaning using a liquid including sulfuric acid and hydrogen peroxide).

Figure 4C:
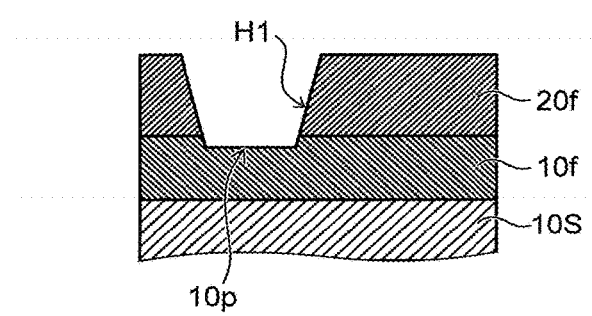

The hard mask 41 is removed as shown in FIG. 4C. The removal includes, for example, performing dry etching using $SF_6$ as an etching gas. Or, the removal includes, for example, wet etching using hydrofluoric acid.

Subsequently, heat treatment is performed (step S120 of FIG. 2).

Figure 4D:
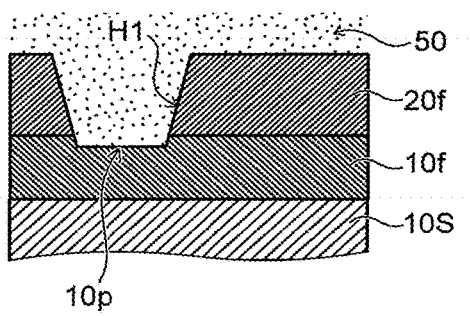

As shown in FIG. 4D, the heat treatment is performed while causing the exposed portion 10p of the first film 10f recited above to contact an atmosphere 50 including $NH_3$. The partial pressure of $NH_3$ in the atmosphere 50 is, for example, not less than 3.3 pascals (Pa) and not more than 180 hectopascals (hPa). The temperature of the heat treatment is, for example, not less than 590° C. and not more than 900° C. The time of the heat treatment is, for example, not less than 1 minute and not more than 2 hours.

After the heat treatment, the insulating film 21 is formed on the portion 10p of the first film 10f recited above (step S130 of FIG. 2). The insulating film 21 is formed also on the side wall of the trench H1 (the side surface of the second film 20f) and on the upper surface 20t of the second film 20f (the second layer 20). The insulating film 21 is, for example, $SiO_2$. For example, the insulating film 21 may be formed by atomic layer deposition (ALD).

Subsequently, the electrode 33 is formed on the insulating film 21 (step S140 of FIG. 2).

Portions of the insulating film 21 are removed; the first conductive portion 31 and the second conductive portion 32 are formed; and the semiconductor device 110 is manufactured. The order of the formation of the electrode 33 and the formation of the conductive portion is arbitrary. At least a portion of these formations may be implemented simultaneously.

Characteristics of the semiconductor device 110 thus manufactured will now be described.

Figure 5:
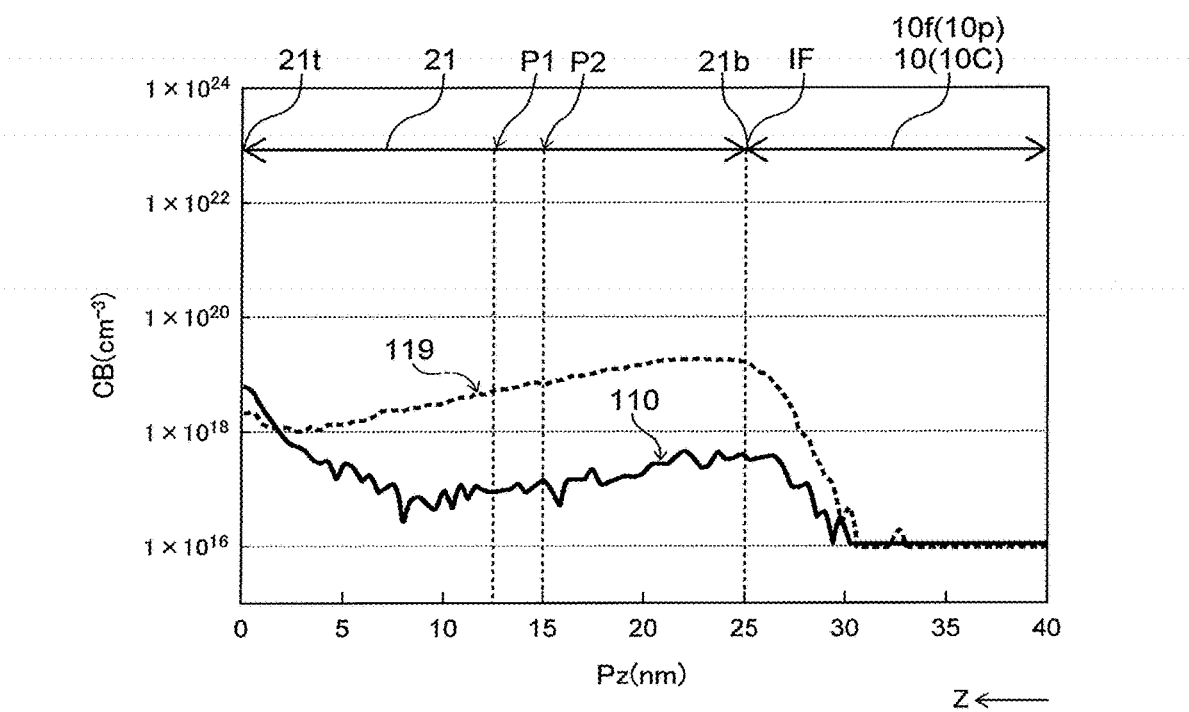
FIG. 5 is a graph illustrating characteristics of semiconductor devices.

FIG. 5 is a graph illustrating characteristics of semiconductor devices.

FIG. 5 shows the characteristics of the semiconductor device 110 and a semiconductor device 119 of a reference example. The heat treatment (step S120) recited above is not implemented in the semiconductor device 119. Otherwise, the semiconductor device 119 is manufactured by a method similar to that of the semiconductor device 110.

FIG. 5 illustrates SIMS analysis results at positions overlapping the electrode 33 in the Z-axis direction. FIG. 5 shows the measurement results of the concentration of boron in the insulating film 21 and the first layer 10. The horizontal axis of FIG. 5 is a position Pz (nm) in the Z-axis direction (the depth direction). The vertical axis is a concentration CB ($cm^{-3}$) of boron.

In the semiconductor device 119 as shown in FIG. 5, the concentration CB of boron inside the insulating film 21 is high. For example, the concentration CB of boron at an interface IF between the insulating film 21 and the first layer 10 is about $1 \times 10^{19}$ $cm^{-3}$. The concentration CB of boron at the central position (the first position P1) in the thickness direction (the depth direction or the Z-axis direction) of the insulating film 21 is about $2 \times 10^{18}$ $cm^{-3}$.

Conversely, in the semiconductor device 110, the concentration CB of boron inside the insulating film 21 is low. For example, the boron concentration at the interface IF (the lower end portion 21b of the insulating film 21) between the insulating film 21 and the third partial region 10C of the first layer 10 is $1 \times 10^{18}$ $cm^{-3}$ or less.

For example, the concentration of boron at the first position P1 of the center is $1 \times 10^{18}$ $cm^{-3}$ or less (e.g., $3 \times 10^{17}$ $cm^{-3}$ or less). The first position P1 is the position of the center in the Z-axis direction of the insulating film 21. The Z-axis direction is aligned with the direction toward the electrode 33 from the third partial region 10C of the first layer 10 (corresponding to the portion 10p of the first film 10f recited above). In the case where the thickness t21 of the insulating film 21 is 25 nm, the distance in the Z-axis direction between the first position P1 and the interface IF between the insulating film 21 and the third partial region 10C of the first layer 10 is 12.5 nm.

The concentration of boron at a second position P2 (referring to FIG. 5) inside the insulating film 21 also is $1 \times 10^{18}$ $cm^{-3}$ or less (e.g., $3 \times 10^{17}$ $cm^{-3}$ or less). The distance along the Z-axis direction between the interface IF and the second position P2 is 10 nanometers (nm).

Thus, in the semiconductor device 110 manufactured by the manufacturing method according to the embodiment, the concentration of boron (the first element) inside the insulating film 21 is lower than that of the semiconductor device 119.

It is considered that the detected first element (in the example boron) originates in the first element inside the gas of the dry etching when forming the trench H1. In the dry etching, the first element remains at the bottom portion of the trench H1. In the semiconductor device 119, the first element remains at the portion 10p of the first film 10f because the heat treatment recited above is not performed. It is considered that the first element diffuses into the insulating film 21.

On the other hand, in the semiconductor device 110, it is considered that much of the first element at the bottom portion of the trench H1 is removed by the heat treatment recited above. For example, the surface portion of the portion 10p of the first film 10f is slightly removed by the heat treatment. It is considered that this removal removes at least a portion of the first element existing at the surface portion. Thereby, it is considered that the concentration of the first element (in the example, boron) inside the insulating film 21 is low compared to that of the semiconductor device 119.

It is considered that the first element (in the example, boron) inside the insulating film 21 functions as traps. Therefore, it is considered that the characteristics of the semiconductor device fluctuate easily if the concentration of the first element (in the example, boron) inside the insulating film 21 is high.

In the semiconductor devices 110 and 119, a prescribed voltage (an acceleration voltage) is applied for a prescribed amount of time between the source electrode (the first conductive portion 31) and the gate electrode (the electrode 33). The difference (the change) of the threshold voltage is evaluated before the application of the voltage (the initial state) and after the application of the voltage (after an accelerated aging test). The difference (the change) of the threshold voltage of the semiconductor device 110 is about 0.2 times the difference (the change) of the threshold voltage of the semiconductor device 119.

Thus, the change of the threshold voltage of the semiconductor device 110 is small. For example, a stable normally-off operation is obtained in the semiconductor device 110. For example, the switching loss can be reduced. In the embodiment, the performance can be improved (the change of the threshold voltage can be suppressed) by the heat treatment in the atmosphere 50 including $NH_3$.

The first element is boron in the example recited above. The gas that is used in the dry etching further includes chlorine. For example, the unevenness of the surface of the bottom surface of the trench H1 (the portion 10p of the first film 10f) can be small when forming the trench H1 by dry etching using such a gas.

Other than boron, the first element included in the gas may be fluorine or bromine. In such a case as well, the first element that remains in the dry etching is removed by the heat treatment. Thereby, the concentration in the insulating film 21 of the first element that may cause traps is reduced; and stable characteristics are obtained.

As recited above, the surface portion of the first film 10f exposed at the bottom portion of the trench H1 is removed by the heat treatment. The heat treatment also has the effect of improving the flatness of the surface of the surface portion of the first film 10f at the bottom portion of the trench H1. For example, the channel mobility improves due to the improvement of the flatness.

The atmosphere 50 of the heat treatment may include $N_2$ and $H_2$ in addition to $NH_3$. For example, the effect of the impurity removal is increased by heat treatment in the atmosphere 50 including $H_2$.

If the temperature of the heat treatment is excessively high (e.g., 1000° C.) in the embodiment, for example, the configuration of the trench H1 changes excessively; and it is difficult to control the configuration of the trench H1. Therefore, it is favorable for the temperature of the heat treatment to be 900° C. or less.

Further, the configuration of the side wall of the upper portion of the trench H1 can be controlled by heat treatment at the appropriate temperature (e.g., 900° C. or less).

FIG. 6A to FIG. 6D are schematic views illustrating the semiconductor devices.

Figure 6A:
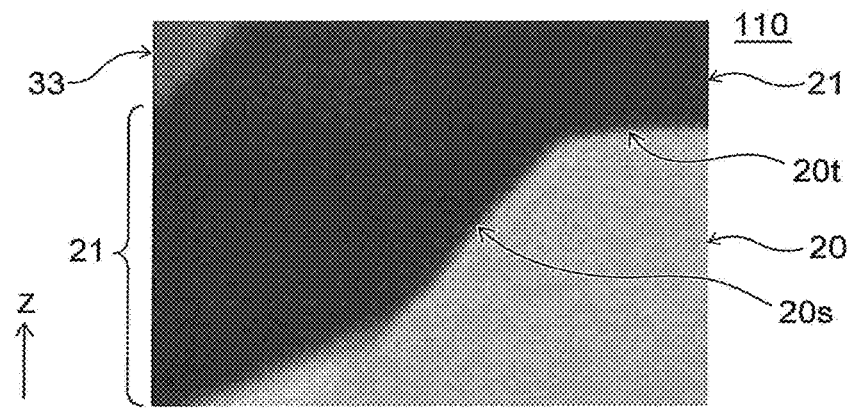
FIG. 6A to FIG. 6D are schematic views illustrating the semiconductor devices.
Figure 6B:
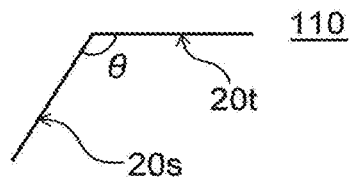
Figure 6C:
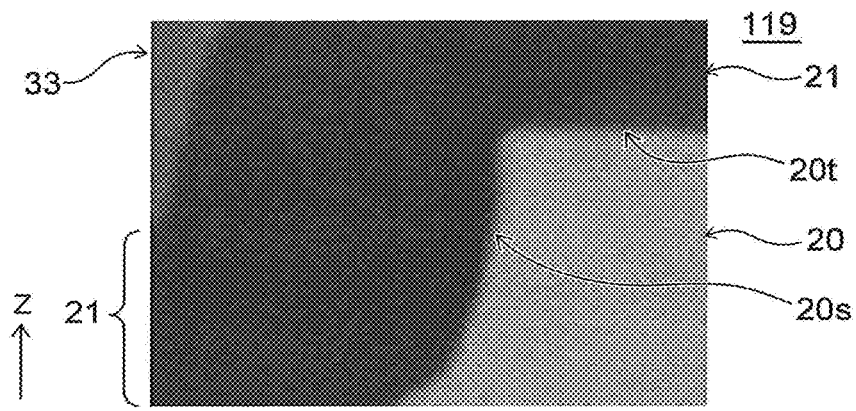
Figure 6D:
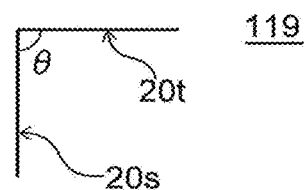

FIG. 6A and FIG. 6B correspond to the semiconductor device 110 recited above. FIG. 6C and FIG. 6D correspond to the semiconductor device 119 recited above. FIG. 6A and FIG. 6C are HAADF-STEM images of the cross section of the side wall portion of the upper portion of the trench H1 (a side surface 20s of the second layer 20) of the semiconductor device. In FIG. 6B and FIG. 6D, the upper surface 20t and the side surface 20s of the second layer 20 are drawn schematically based on FIG. 6A and FIG. 6C respectively.

As shown in FIG. 6A and FIG. 6B, in the semiconductor device 110 in which the heat treatment is performed, an angle θ between the side surface 20s and the upper surface 20t is greater than 90 degrees. The angle θ is about 130 degrees. The angle of the side surface 20s changes smoothly.

As shown in FIG. 6C and FIG. 6D, in the semiconductor device 119 in which the heat treatment is not performed, the angle θ between the side surface 20s and the upper surface 20t is about 90 degrees.

In the semiconductor devices 110 and 119, the processes up to the formation of the trench H1 are the same. Therefore, the performance/non-performance of the heat treatment causes such a difference between the angles θ. It is considered that the side wall of the trench H1 (the side surface 20s of the second layer 20) is tilted due to the heat treatment. It is considered that this is caused by the second layer 20 (the second film 20f) in the region proximal to the opening of the trench H1 being removed easily by the heat treatment compared to the bottom portion of the trench H1.

Thus, according to the manufacturing method according to the embodiment, the upper portion of the side surface 20s can be tilted easily. Thus, after the heat treatment, the second film 20f has the side surface 20s used as the side wall of the trench H1. After the heat treatment, the angle θ between the side surface 20s and the upper surface 20t of the second film 20f (the second layer 20) is 130 degrees or more.

For example, the electric field concentration at the upper portion of the second layer 20 is relaxed by such a tilt of the side surface 20s. Thereby, for example, a high breakdown voltage is obtained.

SECOND EMBODIMENT

Figure 7:
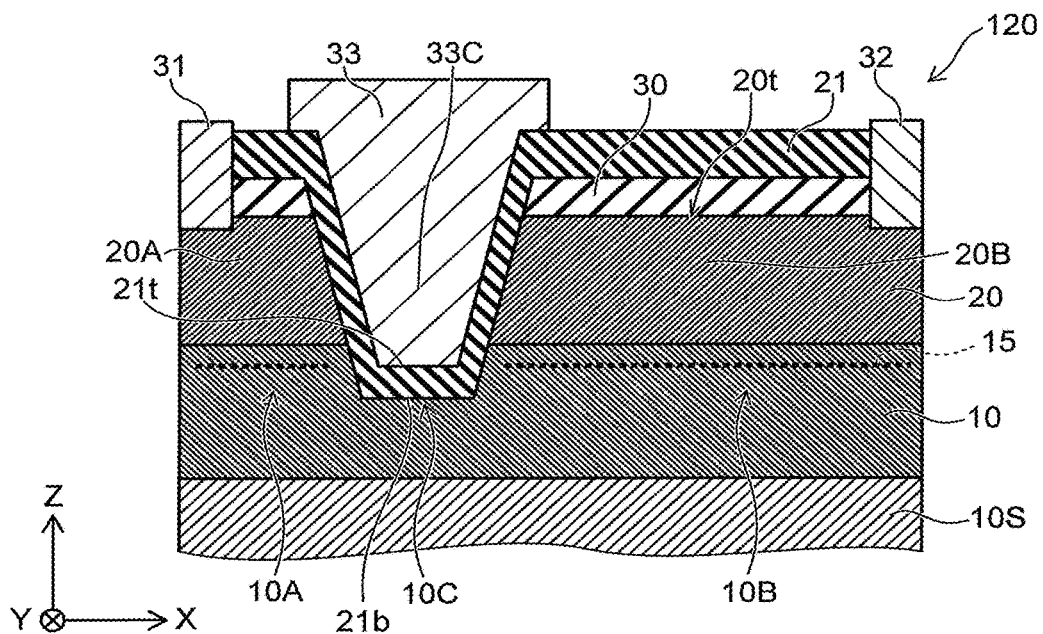
FIG. 7 is a schematic cross-sectional view illustrating a semiconductor device manufactured by a method for manufacturing a semiconductor device according to a second embodiment.

FIG. 7 is a schematic cross-sectional view illustrating a semiconductor device manufactured by a method for manufacturing a semiconductor device according to a second embodiment.

As shown in FIG. 7, the semiconductor device 120 further includes a third layer 30 in addition to the first layer 10, the second layer 20, the insulating film 21, the first conductive portion 31 (the first electrode), the second conductive portion 32 (the second electrode), and the electrode 33. The first layer 10, the second layer 20, the insulating film 21, the first conductive portion 31, the second conductive portion 32, and the electrode 33 are the same as those of the semiconductor device 110; and the third layer 30 will now be described.

A portion of the third layer 30 is provided between the first partial region 10A and a portion of the insulating film 21 in the Z-axis direction. The first portion 20A of the second layer 20 is provided between the first partial region 10A and the portion of the third layer 30 in the Z-axis direction.

Another portion of the third layer 30 is provided between the second partial region 10B and another portion of the insulating film 21 in the Z-axis direction. The second portion 20B of the second layer 20 is provided between the second partial region 10B and the other portion of the third layer 30 in the Z-axis direction.

For example, the third layer 30 is provided between the insulating film 21 and the upper surface 20t of the second layer 20. The third layer 30 is an insulating film. The third layer 30 includes a first material. The first material includes at least one selected from the group consisting of silicon nitride, silicon oxynitride, silicon oxide, aluminum oxide, and gallium oxide. The first material may include at least one selected from the group consisting of silicon nitride and silicon oxynitride.

The third layer 30 includes, for example, silicon nitride in the case where the insulating film 21 is, for example, silicon oxide.

By providing the third layer 30 on the upper surface 20t of the second layer 20, the upper surface 20t of the second layer 20 is not exposed to the high temperature atmosphere including $NH_3$ when performing the heat treatment described below. Thereby, the degradation of the second layer 20 is suppressed. By providing the multiple insulating films (the third layer 30 and the insulating film 21), for example, high reliability is obtained.

The third layer 30 may function as a mask when forming the trench in the second layer 20. An example of the method for manufacturing the semiconductor device 120 will now be described.

An example of the method for manufacturing the semiconductor device 120 according to the embodiment will now be described.

Figure 8:
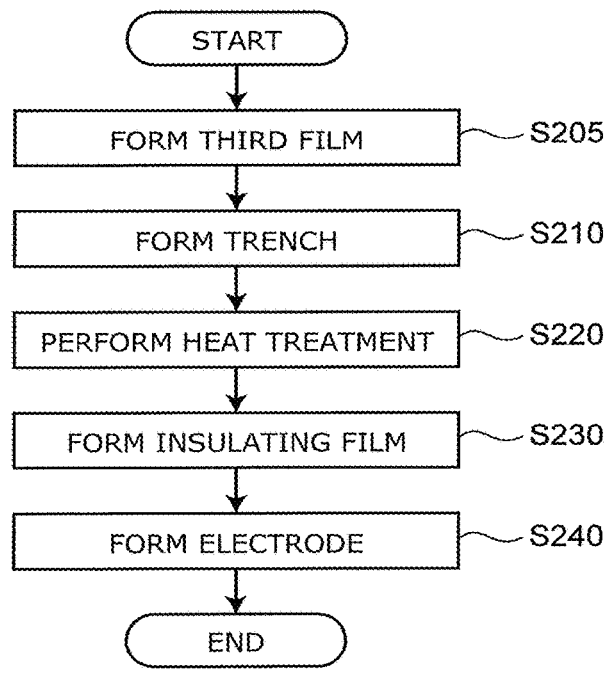
FIG. 8 is a flowchart illustrating the method for manufacturing the semiconductor device according to the second embodiment.

FIG. 8 is a flowchart illustrating the method for manufacturing the semiconductor device according to the second embodiment.

FIG. 9A to FIG. 9D and FIG. 10A to FIG. 10C are schematic cross-sectional views in order of the processes, illustrating the method for manufacturing the semiconductor device according to the second embodiment.

Figure 9A:
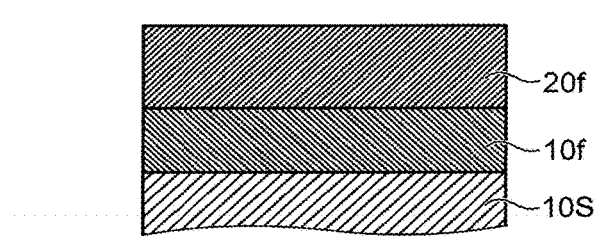
FIG. 9A to FIG. 9D are schematic cross-sectional views in order of the processes, illustrating the method for manufacturing the semiconductor device according to the second embodiment.

As shown in FIG. 9A, the first film 10f that includes $Al_{x1}Ga_{1-x1}N$ (0≤x1<1) is formed on the substrate 10S. The second film 20f that includes $Al_{x2}Ga_{1-x2}N$ (0<x2<1 and x1<x2) is formed on the first film 10f.

Figure 9B:
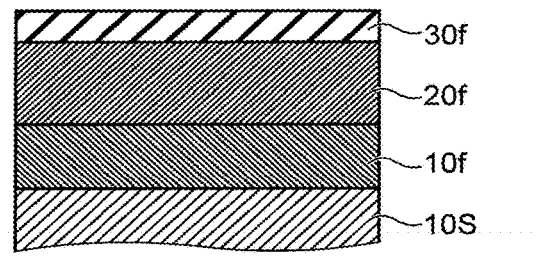

As shown in FIG. 9B, a third film 30f (a film used to form the third layer 30) (e.g., SiN) is formed on the second film 20f. For example, the third film 30f may be formed by ECR sputtering.

Figure 9C:
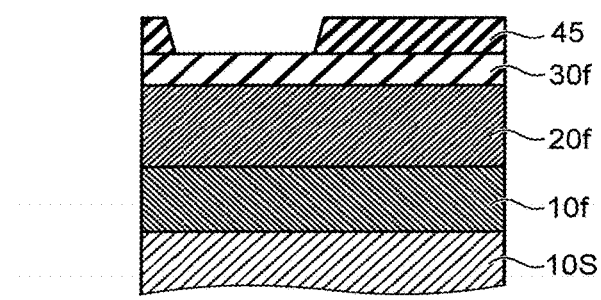

As shown in FIG. 9C, the resist film 45 that has a prescribed opening is formed on the third film 30f. The thickness of the resist film 45 is, for example, about 1 μm to about 2 μm.

Figure 9D:
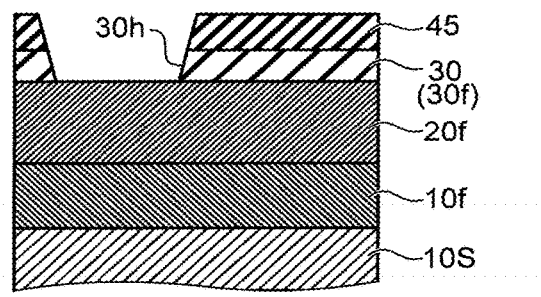

As shown in FIG. 9D, a portion of the third film 30f is removed using the resist film 45 as a mask. The removal includes, for example, dry etching using $SF_6$. Thereby, an opening 30h is formed in the third film 30f. Thereby, the third layer 30 is obtained.

Thus, the third film 30f that has the opening 30h is formed on the second film 20f provided on the first film 10f (step S205 of FIG. 8).

Figure 10A:
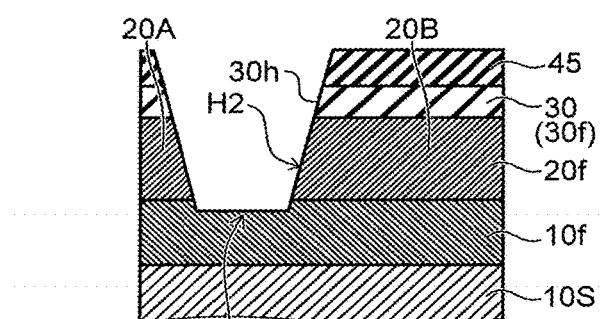
FIG. 10A to FIG. 10C are schematic cross-sectional views in order of the processes, illustrating the method for manufacturing the semiconductor device according to the second embodiment.

As shown in FIG. 10A, a trench H2 is formed by removing a portion of the second film 20f using the resist film 45 and the third film 30f (the third layer 30) as a mask. Thereby, the first portion 20A and the second portion 20B are formed. The removal of the portion of the second film 20f (the formation of the trench H2) is performed by, for example, dry etching using a gas including the first element. The first element is, for example, boron. For example, a gas that includes $BCl_3$ and $Cl_2$ is used as the etching gas. Thereby, the portion 10p of the first film 10f is exposed at the bottom portion of the trench H2.

Thus, the trench H2 is formed by removing a portion of the second film 20f via the opening 30h of the third film 30f (the third layer 30); and the portion 10p of the first film 10f is exposed at the bottom portion of the trench H2 (step S210 of FIG. 8).

Figure 10B:
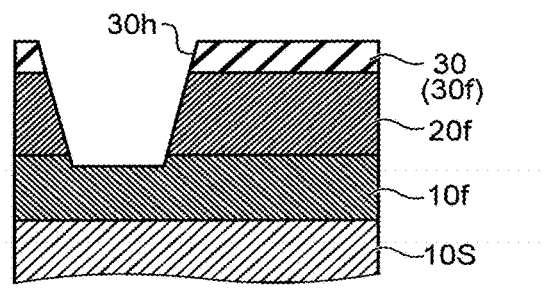

The resist film 45 is removed as shown in FIG. 10B.

Figure 10C:
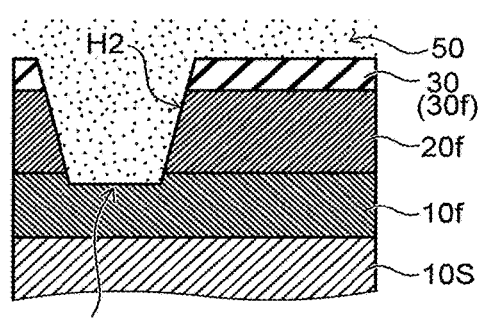

As shown in FIG. 10C, heat treatment of the exposed portion 10p of the first film 10f is performed while causing the portion 10p to contact the atmosphere 50 including $NH_3$ (step S220 of FIG. 8).

The temperature of the heat treatment is, for example, 790° C. or less. The temperature of the heat treatment is, for example, 590° C. or more. The pressure of the atmosphere 50 is, for example, not less than 3.3 hPa and not more than 200 hPa. The partial pressure of $NH_3$ in the atmosphere 50 is, for example, not less than 3.3 hPa and not more than 120 hPa. The atmosphere 50 may further include $N_2$ in addition to $NH_3$. In such a case, the partial pressure of $NH_3$ in the atmosphere 50 is not less than 3.3 hPa and not more than 120 hPa. The time of the heat treatment is, for example, not less than 1 minute and not more than 2 hours. As described below, good characteristics are obtained easily using such conditions.

After the heat treatment, the insulating film 21 is formed on the portion 10p of the first film 10f recited above (step S230 of FIG. 8). The insulating film 21 is formed also on the side wall of the trench H2 (the side surface of the second film 20f) and on the upper surface 20t of the second film 20f. Subsequently, the electrode 33 is formed on the insulating film 21 (step S240 of FIG. 8).

Portions of the insulating film 21 are removed; the first conductive portion 31 and the second conductive portion 32 are formed; and the semiconductor device 120 is manufactured. The order of the formation of the electrode 33 and the formation of the conductive portions is arbitrary. At least a portion of these formations may be implemented simultaneously.

Experimental results in which the temperature of the heat treatment is changed will now be described. In the experiment, the atmosphere 50 includes $NH_3$ and $N_2$. In the experiment, the pressure of the atmosphere 50 is 200 hPa. The partial pressure of $NH_3$ in the atmosphere 50 is 33 hPa. In the experiment, the time of the heat treatment is 20 minutes.

In the experiment, the surface roughness of the bottom portion of the trench H2 (the portion 10p of the first film 10f) is evaluated for multiple samples having different heat treatment temperatures. The insulating film 21, the electrode 33, the first conductive portion 31, and the second conductive portion 32 recited above are formed after the formation of the trench H2; and the mobility is evaluated for the semiconductor devices that are obtained.

FIG. 11A to FIG. 11D are atomic force microscope (AFM) images showing the evaluation results of the semiconductor device.

FIG. 11A corresponds to a sample (the semiconductor device 119) in which the heat treatment is not performed. FIG. 11B, FIG. 11C, and FIG. 11D respectively correspond to temperatures T of the heat treatment of 590° C., 790° C., and 840° C. FIG. 11A corresponds to the 10p portion of FIG. 10B (the portion where the heat treatment is not performed). FIG. 11B to FIG. 11D correspond to the portion 10p of FIG. 10C (the portion after the heat treatment is performed at the prescribed temperature).

As shown in FIG. 11A, the unevenness of the surface is large for the sample (the semiconductor device 119) in which the heat treatment is not performed. As shown in FIG. 11B, the unevenness is reduced for the sample in which the temperature T of the heat treatment is 590° C. As shown in FIG. 11C, the unevenness is reduced markedly for the sample in which the temperature T of the heat treatment is 790° C. Atomic steps are observed in this sample. As shown in FIG. 11D, the unevenness is markedly large for the sample in which the temperature T of the heat treatment is 840° C.

The evaluation results of the unevenness (a surface roughness RMS) of the surface will now be described.

Figure 12A:
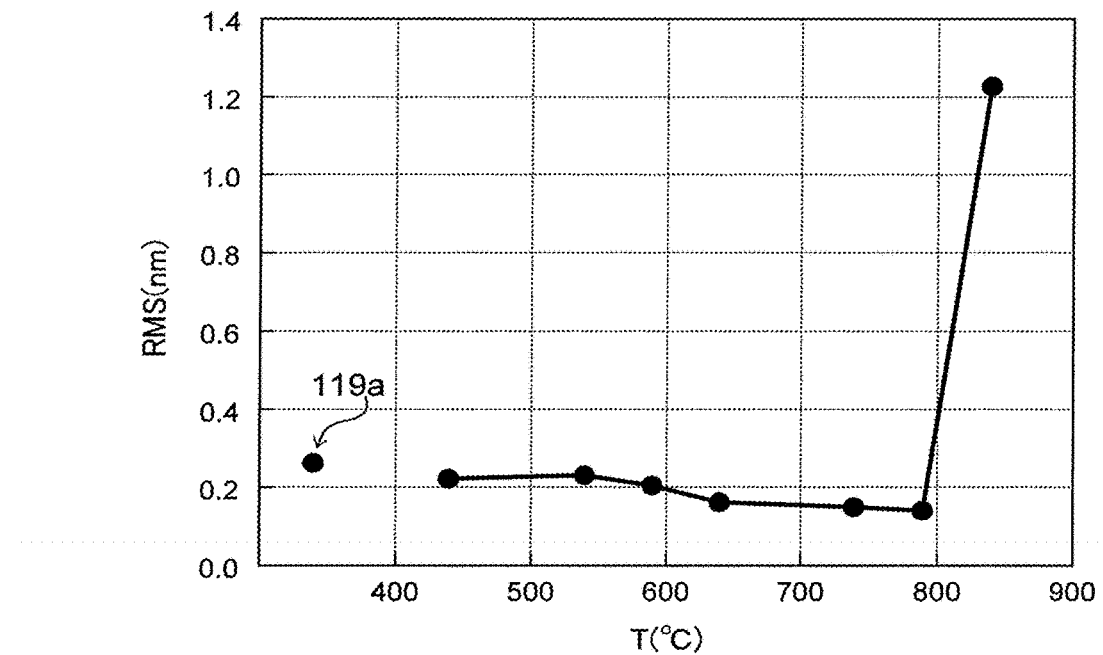
FIG. 12A and FIG. 12B are graphs showing characteristics of the semiconductor device.
Figure 12B:
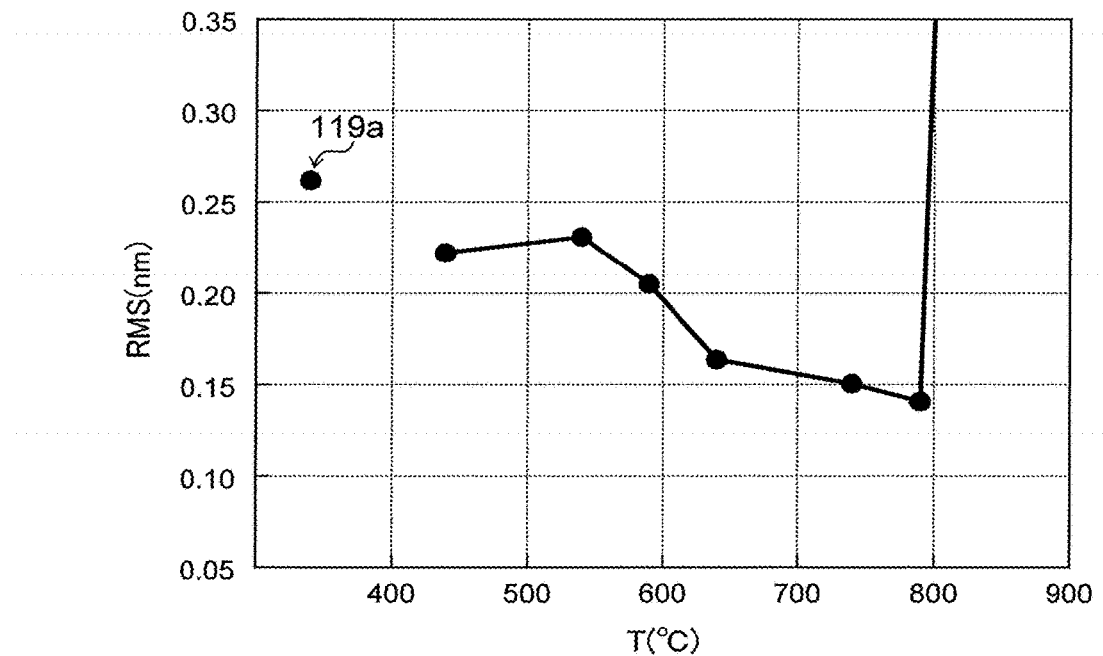

FIG. 12A and FIG. 12B are graphs showing characteristics of the semiconductor device.

In these figures, the horizontal axis is the temperature T (° C.) of the heat treatment. In these figures, the vertical axis is the surface roughness RMS (nm) of the bottom portion of the trench H2 (the portion 10p of the first film 10f). The surface roughness RMS is a value calculated from the result of using AFM to measure the surface unevenness in an area of 1 μm×1 μm. The vertical axis of FIG. 12B is an enlargement of the vertical axis of FIG. 12A. The value of the sample (the semiconductor device 119) in which the heat treatment is not performed also is shown in these figures.

As shown in FIG. 12A, the surface roughness RMS is markedly large in the case where the temperature T of the heat treatment is excessively high (840° C.). A small surface roughness RMS is obtained in the range of temperatures T from 440° C. to 790° C.

As shown in FIG. 12B, the surface roughness RMS becomes small when the temperature T increases to the range of temperatures T from 440° C. to 790° C. In particular, the reduction effect of the surface roughness RMS is large when the temperature T is 590° C. or more.

Figure 13:
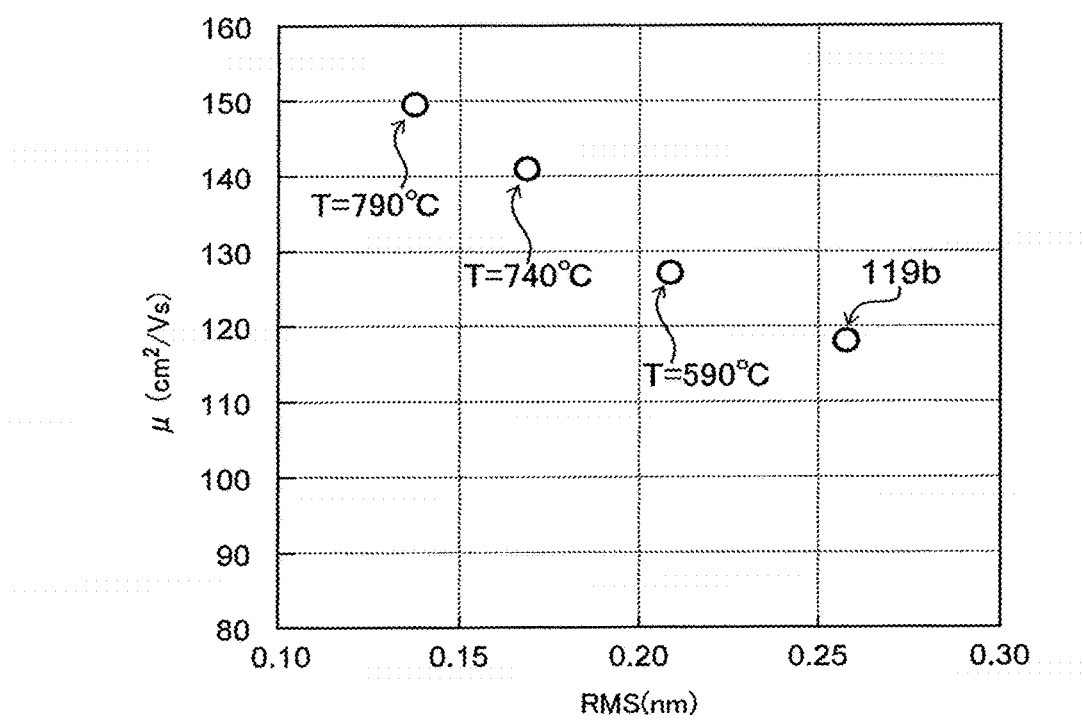
FIG. 13 is a graph showing characteristics of the semiconductor devices.

FIG. 13 is a graph showing characteristics of the semiconductor devices.

The horizontal axis of FIG. 13 is the surface roughness RMS (nm). The vertical axis is a mobility μ (cm$^2$/Vs). It can be seen from FIG. 13 that the mobility μ decreases as the surface roughness RMS increases. A high mobility μ is obtained by reducing the surface roughness RMS. The bottom portion of the trench H2 (the portion 10p of the first film 10f; i.e., the third partial region 10C of the first layer 10) functions as a channel. It is considered that the electrons can move efficiently due to the small surface roughness RMS of this portion. For example, a low ON resistance Ron is obtained due to the high mobility μ.

After the heat treatment in the embodiment, the surface roughness RMS of the surface of the portion 10p of the first film 10f recited above (the bottom portion of the trench H2) is 0.21 nm or less.

Thus, in the embodiment, the improvement of the performance (the increase of the mobility μ and the decrease of the ON resistance Ron) is possible using the heat treatment in the atmosphere 50 including NH$_3$.

The embodiment may include the following configurations.

Configuration 1

A method for manufacturing a semiconductor device, including:

forming a trench and exposing a portion of a first film at a bottom portion of the trench by removing a portion of a second film by dry etching using a gas including a first element, the second film being provided on the first film, the first film including $Al_{x1}Ga_{1-x1}N$ (0≤x1<1), the second film including $Al_{x2}Ga_{1-x2}N$ (0<x2<1 and x1<x2);

performing heat treatment while causing the exposed portion of the first film to contact an atmosphere including NH$_3$;

forming an insulating film on the portion of the first film after the heat treatment; and forming an electrode on the insulating film, the insulating film having a first position at a center in a first direction, the first direction being from the portion of the first film toward the electrode, a concentration of the first element at the first position being 1×10$^{18}$ cm$^{-3}$ or less.

Configuration 2

The method for manufacturing the semiconductor device according to Configuration 1, wherein the first element is boron.

Configuration 3

The method for manufacturing the semiconductor device according to Configuration 1 or 2, wherein the insulating film has a second position, a distance along the first direction between the second position and an interface between the insulating film and the portion of the first film is 10 nanometers, and a concentration of the first element at the second position after the forming of the electrode is 1×10$^{18}$ cm$^{-3}$ or less.

Configuration 4

The method for manufacturing the semiconductor device according to Configuration 1 or 2, wherein a concentration of the first element at an interface between the insulating film and the portion of the first film after the forming of the electrode is not more than 1×10$^{18}$ cm$^{-3}$.

Configuration 5

The method for manufacturing the semiconductor device according to any one of Configurations 1 to 4, wherein a partial pressure of NH$_3$ in the atmosphere is not less than 3.3 pascals and not more than 180 hectopascals.

Configuration 6

The method for manufacturing the semiconductor device according to any one of Configurations 1 to 5, wherein a temperature of the heat treatment is not less than 590° C. and not more than 900° C.

Configuration 7

The method for manufacturing the semiconductor device according to any one of Configurations 1 to 6, wherein the gas further includes chlorine.

Configuration 8

A method for manufacturing a semiconductor device, including:

forming a trench and exposing a portion of a first film at a bottom portion of the trench by removing a portion of a second film provided on the first film, the first film including $Al_{x1}Ga_{1-x1}N$ (0≤x1<1), the second film including $Al_{x2}Ga_{1-x2}N$ (0<x2<1 and x1<x2); and performing heat treatment at a temperature of 790° C. or less while causing the exposed portion of the first film to contact an atmosphere including NH$_3$.

Configuration 9

The method for manufacturing the semiconductor device according to Configuration 8, wherein the temperature is 590° C. or more.

Configuration 10

The method for manufacturing the semiconductor device according to Configuration 8 or 9, further including forming a third film on the second film prior to the forming of the trench, the third film having an opening and including at least one first material selected from the group consisting of silicon nitride, silicon oxynitride, silicon oxide, aluminum oxide, and gallium oxide, the forming of the trench including removing the portion of the second film via the opening.

Configuration 11

The method for manufacturing the semiconductor device according to Configuration 10, wherein the first material includes at least one selected from the group consisting of silicon nitride and silicon oxynitride.

Configuration 12

The method for manufacturing the semiconductor device according to any one of Configurations 8 to 11, wherein a pressure of the atmosphere is not less than 3.3 hectopascals and not more than 200 hectopascals.

Configuration 13

The method for manufacturing the semiconductor device according to any one of Configurations 8 to 12, wherein a partial pressure of $NH_3$ in the atmosphere is not less than 3.3 hectopascals and not more than 120 hectopascals.

Configuration 14

The method for manufacturing the semiconductor device according to any one of Configurations 8 to 12, wherein
  the atmosphere further includes $N_2$, and
  a partial pressure of $NH_3$ in the atmosphere is not less than 3.3 hectopascals and not more than 120 hectopascals.

Configuration 15

The method for manufacturing the semiconductor device according to any one of Configurations 8 to 14, wherein the removing of the portion of the second film includes implementing dry etching using a gas including boron and chlorine.

Configuration 16

The method for manufacturing the semiconductor device according to any one of Configurations 8 to 15, further including:
  forming an insulating film on the portion of the first film after the heat treatment; and
  forming an electrode on the insulating film.

Configuration 17

The method for manufacturing the semiconductor device according to any one of Configurations 1 to 16, wherein
  the second film has a side surface used as a side wall of the trench after the heat treatment, and
  an angle between the side surface and an upper surface of the second film is 130 degrees or more.

Configuration 18

The method for manufacturing the semiconductor device according to any one of Configurations 1 to 17, including further forming a first conductive portion electrically connected to a first portion of the second film and further forming a second conductive portion electrically connected to a second portion of the second film,
  at least a portion of the electrode being positioned between the first portion and the second portion.

Configuration 19

The method for manufacturing the semiconductor device according to any one of Configurations 1 to 18, wherein a surface roughness RMS of a surface of the portion of the first film after the heat treatment is 0.21 nm or less.

Configuration 20

A method for manufacturing a semiconductor device, including:
  forming a trench and exposing a portion of a first film at a bottom portion of the trench by removing a portion of a second film provided on a first film, the first film including $Al_{x1}Ga_{1-x1}N$ (0≤x1<1), the second film including $Al_{x2}Ga_{1-x2}N$ (0<x2<1 and x1<x2); and performing heat treatment at a temperature of 900° C. or less while causing the exposed portion of the first film to contact an atmosphere including $NH_3$.

Configuration 21

The method for manufacturing the semiconductor device according to Configuration 20, wherein the heat treatment includes causing an upper surface of the second film to contact the atmosphere.

According to the embodiments, a method for manufacturing a semiconductor device can be provided in which improvement of the performance is possible.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor memory devices such as layers, films, electrodes, conductive regions, insulating films, substrates, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all methods for manufacturing semiconductor devices practicable by an appropriate design modification by one skilled in the art based on the method for manufacturing semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device, the method comprising:
  forming a trench and exposing a portion of a first film at a bottom portion of the trench by removing a portion of a second film by performing dry etching using a gas comprising boron, in which the second film is provided on the first film, the first film comprises $Al_{x1}Ga_{1-x1}N$ (0≤x1<1), the second film comprises $Al_{x2}Ga_{1-x2}N$ (0<x2<1 and x1<x2);
  performing heat treatment while causing a portion being exposed of the first film to contact an atmosphere comprising $NH_3$;

forming an insulating film on the portion of the first film after the heat treatment; and forming an electrode on the insulating film, wherein:

the insulating film has a first position at a center in a first direction, the first direction being from the portion of the first film toward the electrode; and a concentration of the boron at the first position is $1\times10^{16}$ cm$^{-3}$ or more and $1\times10^{18}$ cm$^{-3}$ or less.

2. The method according to claim 1, wherein:

the insulating film has a second position;

a distance along the first direction between the second position and an interface between the insulating film and the portion of the first film is 10 nanometers; and a concentration of the boron at the second position after the forming of the electrode is $1\times10^{18}$ cm$^{-3}$ or less.

3. The method according to claim 1, wherein a concentration of the boron at an interface between the insulating film and the portion of the first film after the forming of the electrode is $1\times10^{18}$ cm$^{-3}$ or less.

4. The method according to claim 1, wherein a partial pressure of $NH_3$ in the atmosphere is not less than 3.3 pascals and not more than 180 hectopascals.

5. The method according to claim 1, wherein a temperature of the heat treatment is not less than 590° C. and not more than 900° C.

6. The method according to claim 1, wherein the gas further comprises chlorine.

7. The method according to claim 1, wherein boron that remains in the insulating film functions as traps.

8. The method according to claim 1, wherein a thickness of the insulating film is not less than 5 nm and not more than 100 nm.

9. The method according to claim 1, wherein the concentration of boron at the first position is $1\times10^{16}$ cm$^{-3}$ or more and $3\times10^{17}$ cm$^{-3}$ or less.

10. The method according to claim 2, where the concentration of boron at the second position after the forming of the electrode is $1\times10^{16}$ cm$^{-3}$ or more.

11. The method according to claim 3, where the concentration of boron at the interface is $1\times10^{16}$ cm$^{-3}$ or more.

* * * * *